United States Patent [19]

Muller et al.

[11] Patent Number: 4,618,916

[45] Date of Patent: Oct. 21, 1986

[54] LIPID BILAYER MEMBRANE ELECTRONIC CIRCUIT COMPONENTS

[75] Inventors: Robert L. Muller, City Island; Olaf S. Andersen, New York, both of N.Y.

[73] Assignee: Cornell Research Foundation, Inc., Ithaca, N.Y.

[21] Appl. No.: 683,255

[22] Filed: Dec. 18, 1984

[51] Int. Cl.$^4$ .................. H01G 9/00; G11C 11/00
[52] U.S. Cl. ...................... 361/434; 365/153
[58] Field of Search ............... 361/434, 433 J, 433 E, 361/433 L; 365/153

[56] References Cited

U.S. PATENT DOCUMENTS

| | | | |
|---|---|---|---|
| 3,017,612 | 1/1962 | Singer | 365/153 |
| 3,158,798 | 11/1964 | Sauder | 361/434 |
| 3,295,028 | 12/1966 | Argue et al. | 361/434 X |
| 3,354,439 | 11/1967 | Mitchell | 365/153 |
| 3,700,975 | 10/1972 | Butherus et al. | 361/434 X |

OTHER PUBLICATIONS

Annals of the New York Academy of Sciences, 1975, vol. 264, pp. 247-264.
Chemical Abstracts, 1979, vol. 91, Abstract 91:51498E.
Current Topics in Bioenergetics, 1969, vol. 3, pp. 157-249.
Journal of General Physiology, 1976, vol. 67, pp. 703-729.
Journal of General Physiology, 1976, vol. 67, pp. 731-748.
Journal of General Physiology, 9/1982, vol. 80, pp. 403-426.
Tetrahedron Letters, 1981, vol. 22, pp. 5217-5220.
Chemical Abstract, vol. 78, 1973, pp. 381-382, Abstract 21621D.
Digital Circuits and Microprocessors, 1982, p. 227.
Journal of General Physiology, 1972, vol. 60, pp. 285-306.
Journal of General Physiology, 1972, vol. 60, pp. 263-284.
Journal of General Physiology, 8/1981, vol. 78, pp. 171-200.
Journal of General Physiology, 8/1981, vol. 78, pp. 201-229.
Journal of General Physiology, 9/1982, vol. 80, pp. 427-449.

*Primary Examiner*—Donald A. Griffin
*Attorney, Agent, or Firm*—Davis Hoxie Faithfull & Hapgood

[57] ABSTRACT

Particular circuit component structures, and methods of using such structures, based upon a lipid bilayer membrane, a first liquid phase that is in contact with one surface of the membrane and a second liquid phase that is in contact with the other surface of the membrane. A substance inducing voltage-dependent conductance in the membrane is present in one of the liquid phases.

30 Claims, 13 Drawing Figures

LIPID BILAYER MEMBRANE ELECTRONIC CIRCUIT COMPONENTS

This invention was made with Government support under Grant Number GM-21342, awarded by the National Institutes of Health, Department of Health and Human Services. The Government has certain rights in this invention.

BACKGROUND OF THE INVENTION

This invention relates to electronic circuit components. Electronic circuit components have commonly been made in significant part of inorganic semiconductor material, such as silicon or gallium-arsenide, which have been doped with a variety of compounds in part to allow the physical state (e.g., the conductance) of the semiconductor material to be controlled by the applied potential. A wide variety of electrical characteristics have been realized with such components.

The present invention substantially differs from the foregoing conventional semiconductor devices. Specifically, the electronic components disclosed herein are fabricated in significant part from organic materials, rather than inorganic materials; because of this, it is possible to control the state of the components by electrical potential changes that are considerably smaller than those used to control the state of conventional semiconductor devices (100–1000 mV vs. 3000–5000 mV).

This decrease in the operating voltage range occurs because the conductance of the disclosed components are very steeply voltage-dependent. One advantage of decreasing the operating voltage range is that it reduces a device's power consumption, which varies with the square of the operating voltage. This means that such devices in principle can be more densely packed than is possible with conventional solid state devices. In addition, the reduction in the operating voltage and power consumption should allow operation of the components from the voltage and power delivered from a single (solar) power cell.

SUMMARY OF THE INVENTION

The present invention in part comprises particular circuit component structures that employ a lipid bilayer membrane, where one liquid phase is in contact with one surface of the membrane and a second liquid phase is in contact with the other surface of the membrane. Both liquid phases are electrically conductive electrolyte solutions. In addition, one of the liquid phases, or the membrane, contains a substance that induces a voltage-dependent conductance in the membrane. Means are provided for inducing an electrical potential across the membrane. Such means can be an electrode placed in contact with each liquid phase. Means are also provided for maintaining the chemical composition of the two aqueous phases approximately constant in the face of current flow (ion movement) across the membrane.

A lipid bilayer membrane is a thin sheet consisting of two monolayers of lipid molecules, which is stable only if sandwiched between two polar (usually aqueous) liquid phases. The structure is stable because of the amphipathic properties of lipid molecules: the polar ends of the lipid molecules are attracted to the polar ends of the liquid phases and are anchored in the polar liquid phases. In contrast, the non-polar ends are repulsed from the polar liquid phases and, by mutual attraction to each other, form the membrane interior. Thus, the non-polar (hydrocarbon, or "oily") ends from one monolayer abut the non-polar ends from the other monolayer.

The oily membrane interior is a very poor medium for dissolving small ions, such as chloride, hydrogen or potassium ions. A lipid bilayer is therefore normally essentially non-conductive; i.e., almost completely impermeable to ions. For example, if a lipid bilayer membrane were sandwiched between two electrically conductive ionic solutions, and an electrical potential difference were applied across the membrane, very little current would flow (about $10^{-10}$ A/cm$^2$ for a 100 mV potential difference). In contrast to the lipid bilayer's almost complete impermeability to small ions, the membrane is very permeable to small non-polar molecules, such as molecular hydrogen, $H_2$.

The present invention also comprises a method of using the circuit component described above. Specifically, the method comprises changing the conductance of the membrane by applying a first, state-changing potential difference across the membrane. This potential difference has a magnitude sufficient to change the conductivity of the membrane, by driving into or out of the membrane, the substance inducing the voltage-dependent conductance.

The conductivity of the membrane is then sensed at some later time. Specifically, a second, interrogation potential, or interrogation current, is at some later time applied across the the membrane in a direction which causes current to flow across the membrane (positive charge to flow from the first liquid phase to the second). This interrogation potential or current should have a magnitude less than that required to change the membrane conductance. The magnitude of the current flowing across the membrane that results from the application of the interrogation potential, or the potential across the membrane that results from the application of the interrogation current, is sensed to monitor the conducting state of the component.

Used in the way just described, the circuit component can be employed as a memory element. Indeed, as explained in greater detail below, the component described above is analagous to semiconductor dynamic memory, and can be periodically refreshed. Also, more than one component can be grouped together to constitute a memory array.

In order to avoid depletion of the ionic charge carriers in one of the liquid phases, and their accumulation in the second liquid phase, means can be provided to maintain the chemical composition of the liquid phases approximately constant. A mechanical embodiment of such means can comprise the perfusion of both compartments with solutions that have the same composition as the two solutions had initially (before the component was activated by a state-changing potential). An electrochemical embodiment of such means comprises an acidic solution as the electrically conductive ionic solution constituent of the first as well as the second liquid phases, with appropriate electrodes placed in contact with the first liquid (the first electrode) and the second liquid (the second electrode). The electrodes, which apply electrical potential difference across the membrane, also provide the means for recycling the current carriers. The first electrode will convert molecular hydrogen to hydrogen ions (protons) when it is electrically positive relative to the second electrode. The second electrode, on the other hand, will convert protons to molecular hydrogen when it is electrically negative relative to the first electrode. (For the purpose of this disclosure, the potential is defined to be positive when the first electrode is electrically positive relative to the second electrode.) The electrodes must be made of a material which is capable of catalyzing the reaction:

$$H_2 \rightleftharpoons 2H \rightleftharpoons 2H^+ + 2e^-,$$

where $H_2$ denotes molecular hydrogen, H is atomic hydrogen, $H^+$ denotes a hydrogen cation (proton) while $e^-$ denotes an electron. The protons are the current carriers across the membrane, while the electrons are the current carriers in the external circuitry. Molecular hydrogen is capable of diffusing across the membrane, from one electrode (e.g., the second electrode) to the other (the first electrode). The preferred material for the electrodes is platinum, which is capable of catalyzing the above reaction. The component can be encapsulated and hermetically sealed to ensure that the molecular hydrogen does not diffuse away.

With modifications, the component described above can be made to have two stable states. Specifically, an ionic concentration difference is maintained between the two liquid phases, and a substance that induces voltage independent conductance in the membrane is added to both of the liquid phases. The ionic permeability of the voltage dependent and voltage independent substance must differ. The component modified as described can also be used a a memory element, but its behavior is analagous to semiconductor static memory.

These and other embodiments are described in greater detail below.

DESCRIPTION OF THE PREFERRED EMBODIMENTS

Figure 1:
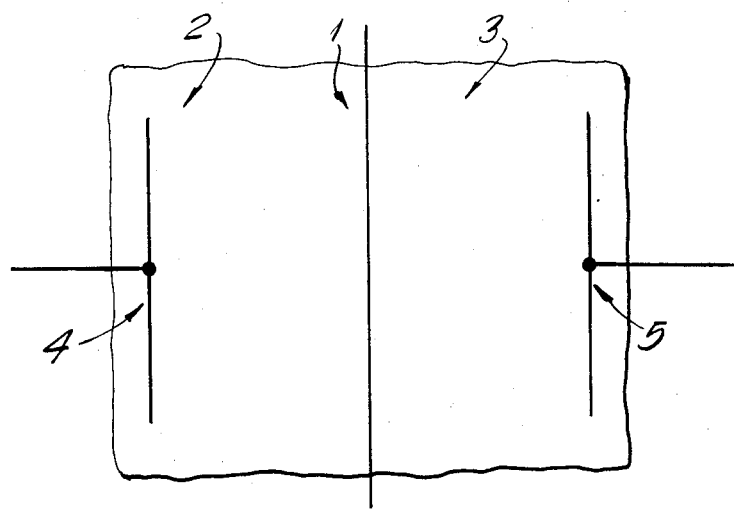
FIG. 1 is a schematic drawing showing the structure of the present invention.

Referring to FIG. 1, there is shown a lipid bilayer membrane 1, a first liquid phase 2 in contact with one surface of the membrane 1, and a second liquid phase 3 in contact with the other surface of the membrane. Also shown are a first electrode 4 and a second electrode 5, which comprise the means for applying electrical potential differences across membrane 1, between the first liquid phase 2 and the second liquid phase 3. The system can be hermetically sealed. The liquid phases 2 and 3 are electrically conductive electrolyte solutions, chosen such that particular ionic species (e.g., protons) will be capable of moving through the membrane at a very high rate when the conductance of the membrane has been increased. The first liquid phase 2, or the membrane 1, or both, in addition contain material that is capable of inducing voltage-dependent conductances in the membrane 1, as explained below. The two liquid phases and the membrane can, in addition, contain molecular hydrogen, which serves to recirculate protons (if they are the current carriers) back across the lipid bilayer in an electrically neutral form.

In FIG. 1 a material capable of inducing voltage-dependent conductances in the membrane is a constituent of first liquid phase 2. Such a material is characterized by its ability in the structure of FIG. 1 to render membrane 1 more and more permeable to ions, as explained later in greater detail, upon the application of a greater and greater potential difference between the electrodes 4 and 5.

Figure 2:
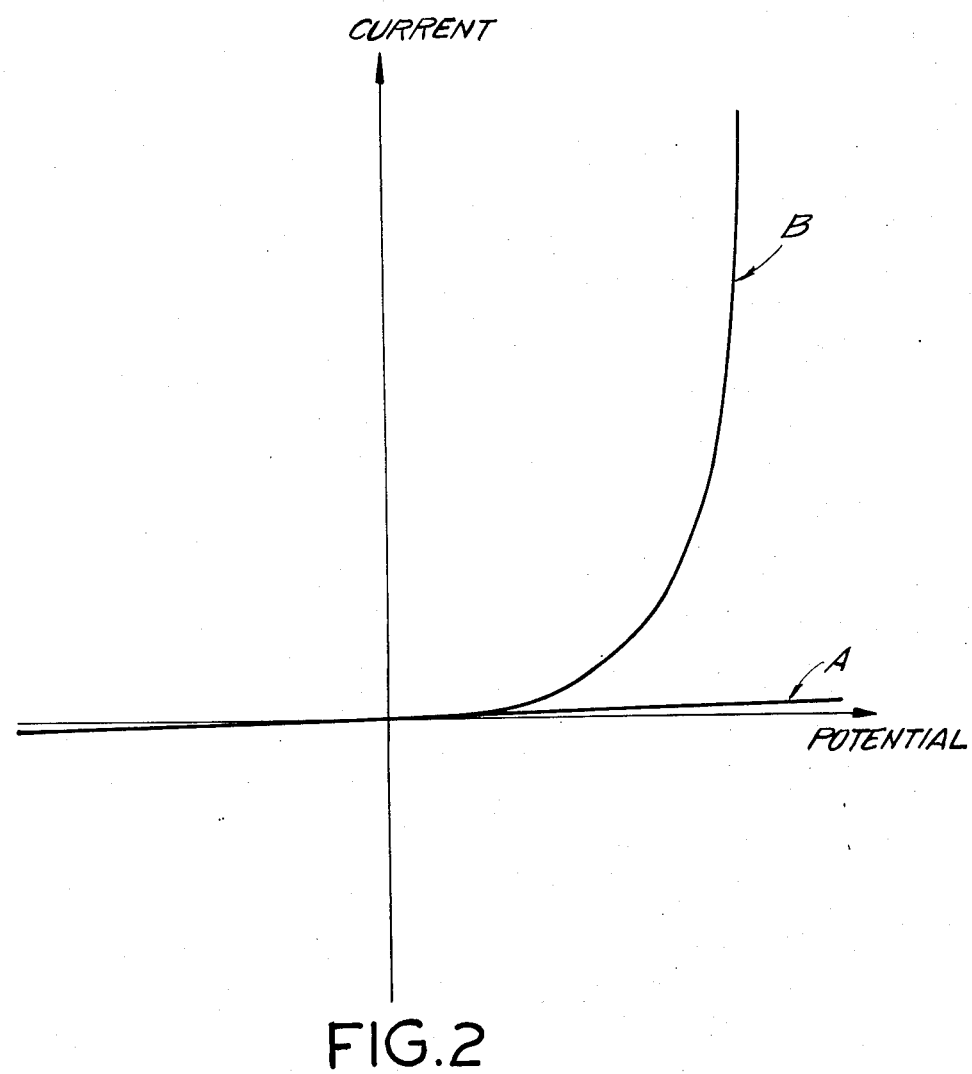
FIG. 2 is a graph showing a stationary current-voltage characteristics of one embodiment of the structure of FIG. 1.

In a certain voltage range, which depends upon the concentration of the material in liquid phase 2 inducing the voltage-dependent conductance, membrane 1 will be effectively non-conductive. At higher potentials, on the other hand, the conductance becomes a very strong function of the magnitude of potential. FIG. 2 is a graph that provides a qualitative illustration of the characteristics of the structure of FIG. 1 in the present embodiment; it depicts the current across the membrane (the current flowing between electrodes 4 and 5) as a function of applied voltage in the absence, curve A, and presence, curve B, of the material inducing voltage-dependent conductance. The steepness of the current-voltage curve depicted in FIG. 2 reflects the steep voltage-dependence of the conductance of the membrane. The relation between voltage and conductance is illustrated in FIG. 3.

The ability to operate the disclosed component at low potentials is strongly dependent upon the voltage-dependence of the membrane conductance. The larger the relative conductance change for a given change in membrane potential, the smaller the operating voltage needs to be. A number of molecules of biological origin can induce conductance changes in the membrane of about 1 million-fold for a 60 mV potential change. For comparison, the conductance change across a P-N junction in silicon varies by ten-fold or less for a 60 mV potential difference. Thus material comprising the molecules just referred to make feasible low-voltage electronic devices.

The material inducing the voltage-dependent conductances should ideally be confined to the liquid phase to which it originally was added, and to the membrane, and should preferably not find its way into the other liquid phase. If it does permeate across the membrane, into the other liquid phase, the desired distribution of material can be maintained by continuous or periodic perfusion of the two liquid phases.

Figure 3:
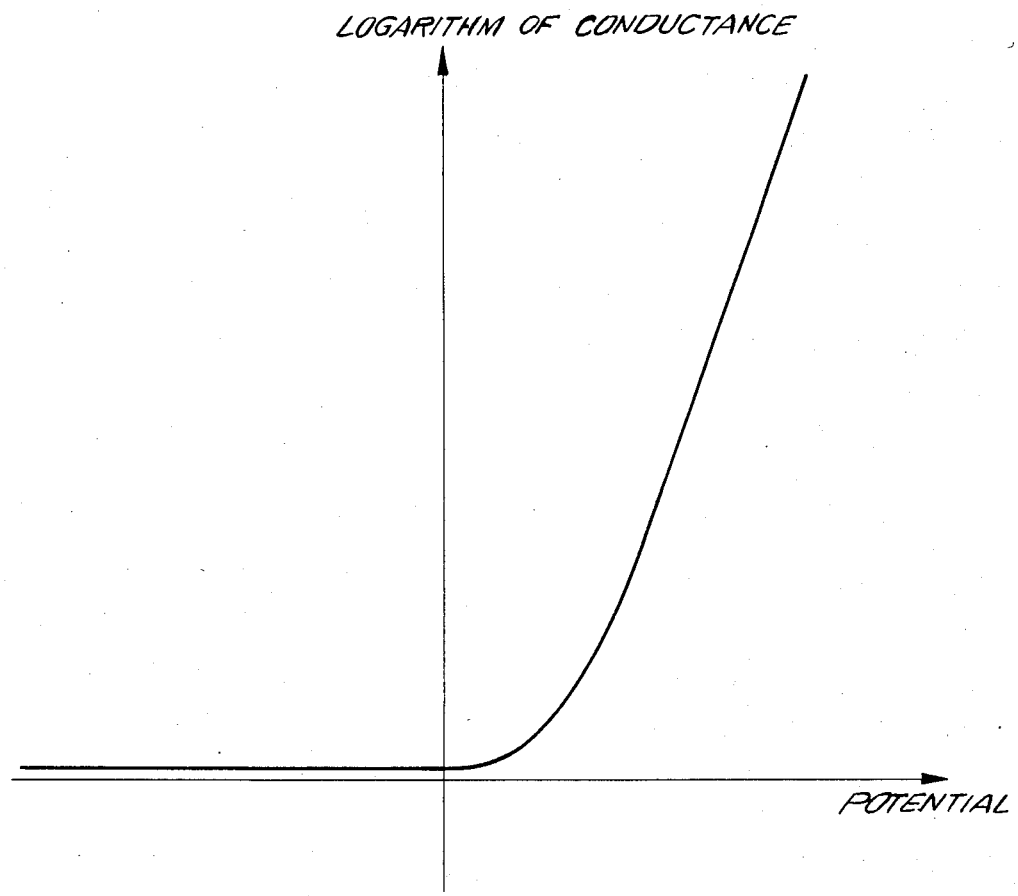
FIG. 3 is a graph showing the stationary conductance-voltage characteristic underlying the graph in FIG. 2.

Monazomycin is one material that, when dissolved in liquid phase 2, is capable of inducing voltage-dependent conductance changes in membrane 1, as qualitatively shown in FIG. 3. Monazomycin is an antibiotic produced by *Streptomyces mashiuensis* (streptomyces strain No. 3682-JTt₁), which is available from American Type Culture Collection (12301 Parklawn Drive, Rockville, Md. 20852) as Streptoverticillium, ATCC #27605. Monazomycin contains one amino group that gives it a single positive charge at pH less than 8, and which provides the molecular basis for the steeply voltage-dependent conductance changes that can be induced in lipid bilayer membranes at monazomycin concentrations ranging from about $10^{-9}$ to $10^{-4}$M.

Monazomycin slowly permeates across membrane 1. It is possible, however, to chemically modify the monazomycin molecule, so that the membrane becomes effectively impermeable to it. A highly polar group, e.g. a sulfated sugar, coupled to the mannose group 'anchors' the monazomycin molecules to the liquid phase which it originally was added, thereby preventing any permeation. In the remaining part of this disclosure, unless otherwise stated, the term monazomycin will be used to denote both the native molecule and an appropriately modified analog.

The voltage-dependent conductance changes that monazomycin and other materials induce in lipid bilayer membranes are caused by the creation, or destruction, of "channels" or "pores" in the membranes, which creation or destruction occurs when the potential difference across the membrane is varied. The configuration of the channel may vary with the material forming it: in the case of monazomycin, it is believed to be composed of approximately six monazomycin monomers spanning the bilayer and arranged like barrel staves to form a channel. When the potential is positive, these channels allow passage of cations from liquid 2 to liquid 3, but do not, to any significant degree, allow the passage of anions from liquid 3 to liquid 2. The macroscopic conductance of the membrane 1 is a function of the total number of channels in the membrane, which in turn is a function of the applied potential. When the membrane potential is low, monazomycin will not induce a significant conductance in the membrane. However, as the potential becomes more and more positive, an increasingly large number of channels will be created to form conductive pathways across the lipid bilayer membrane.

Figure 4:
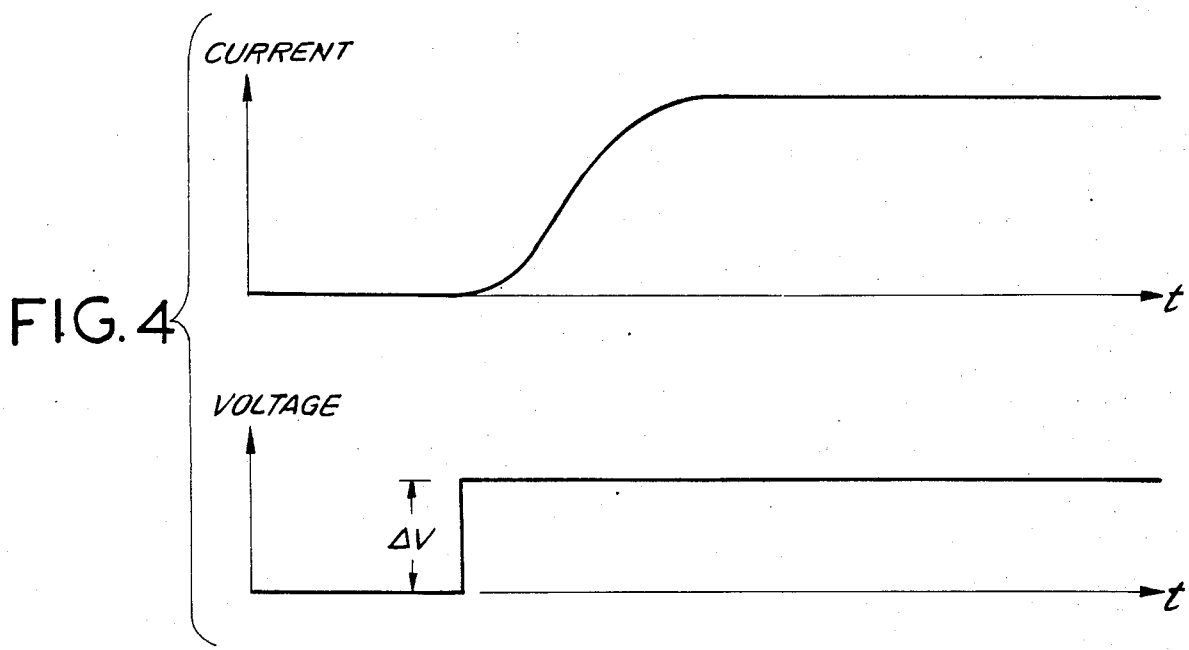
FIG. 4 is a graph showing the time-variation of the membrane conductance after the application of a large transmembrane potential difference across a membrane which has not been exposed to a potential difference for a very long time.

The conductance of membrane 1 is a function not only of the magnitude of the potential applied across the membrane, but also of time: both of the length of time a potential difference is applied across the membrane, and of the length of time that has elapsed from the last application of a membrane potential difference. FIG. 4 illustrates the relation between membrane conductance and time (t) after the application of a state-changing potential ($\Delta V$) across a membrane that initially (at t=0) was in the low-conductance state. The conductance rises along an S-shape curve to reach a final stationary level. The rate of rise of the conductance depends upon the chemical composition of the membrane, which can be varied by changing the composition of the membrane-forming solution. The time-variation of the conductance is further a function of the monazomycin concentration in the first liquid phase and of the applied potential.

Figure 5:
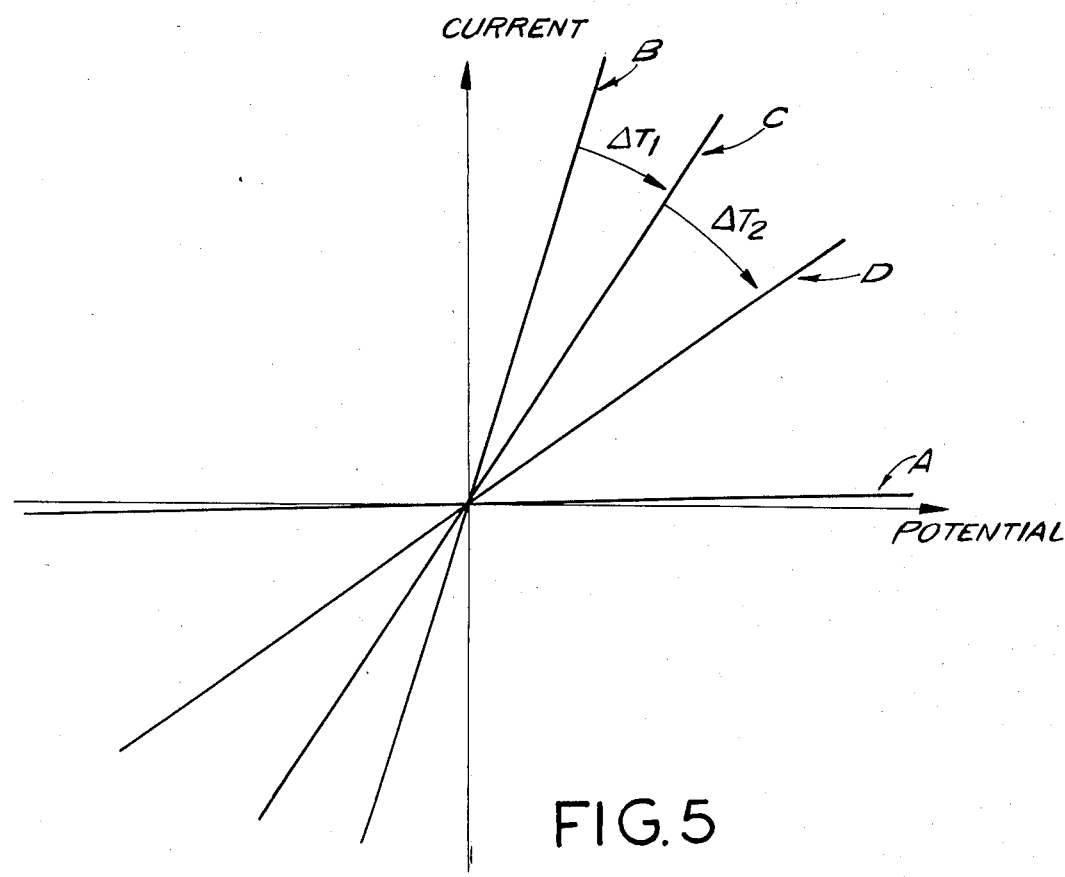
FIG. 5 is a graph of the instantaneous current-voltage characteristics at various times both before and after the application of the potential difference illustrated in FIG. 4.
Figure 6A:
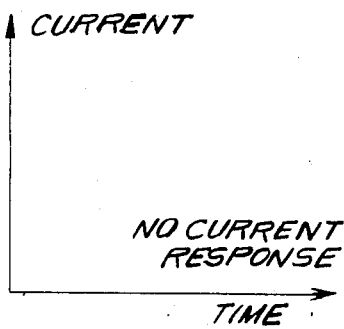
FIGS. 6A–6F are graphs showing the current response to three successive transmembrane potential differences, where the first and last are too small to induce channels into the membrane, while the middle is a larger, state-changing potential.
Figure 6B:
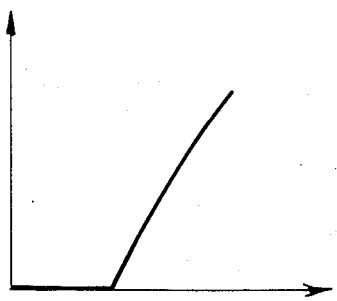
Figure 6C:
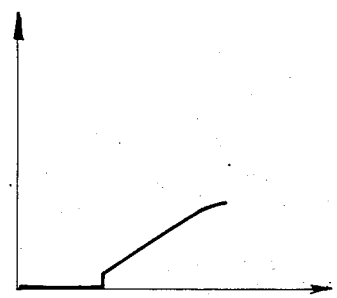
Figure 6D:
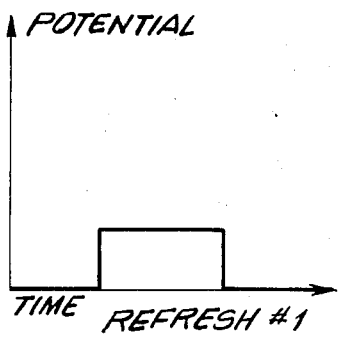
Figure 6E:
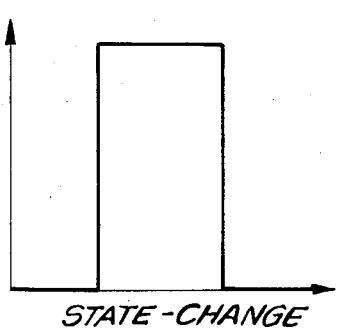
Figure 6F:
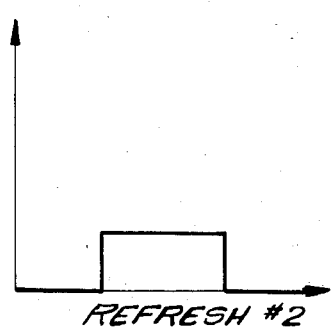

The conductance at any time further depends upon the time that has elapsed since a previous application of a potential across the membrane. FIG. 5 depicts current-voltage characteristics of a monazomycin-modified membrane, before and at various times after the application of a state-changing potential difference across membrane 1 of the structure shown in FIG. 1. It is assumed that the curves of FIG. 5 were generated after a very long time passed since any previous application of a potential difference across membrane 1. The membrane conductance is probed (interrogated) with a voltage pulse having an amplitude that is sufficiently low (and a duration which is sufficiently short) that the state of the membrane is not significantly affected by the interrogation.

Curve A shows the measured current between electrodes 4 and 5 as a function of the applied (interrogation) potential before the state-changing potential was applied. This curve is same as the current-voltage curve shown for the unmodified membrane in FIG. 2. It can be seen that the current responses to the interrogation potentials are very small indeed. Curve B shows the current-voltage relation obtained just after the application of the state-changing potential. The current responses to the interrogation potentials are very much larger than before the state-changing potential was applied, and the difference between the current responses shown in Curve A and Curve B is easily seen.

Note that the current-voltage characteristics depicted by curve B in FIG. 5 differs substantially from the current-voltage characteristic illustrated in FIG. 2 for the active membrane. The difference resides in the way in which the two curves are determined. The curve in FIG. 2 depicts the stationary current-voltage relation, where the time-dependent channel formation/breakdown processes were allowed to proceed until equilibrium has been achieved (i.e. until the current no longer varies as a function of time, see FIG. 4). Curve B in FIG. 5, on the other hand, depicts the "instantaneous" current-voltage characteristic, where the current is measured before the number of channels in the membrane can vary.

If a time interval $\Delta T_1$ is allowed to pass after the application of the state-changing potential, the current-voltage characteristics that result from applying a potential difference between electrodes 4 and 5 do not replicate curve B. Rather, the resultant curve will have a smaller slope, as shown by curve C of FIG. 5. The significant aspect of the difference between curve B and curve C is that the number of channels in the membrane decreases as a function of time, and at a constant potential less current will flow between the electrodes.

As the time interval between the application of the state-changing potential and the interrogation potential becomes increasingly longer, the current-voltage characteristics become increasingly akin to curve A in FIG. 5. Curve D exhibits the current-voltage relationship after a time interval $\Delta T_2$ where $\Delta T_2 > \Delta T_1$. After a sufficiently long time interval, the interrogation yields a current-voltage curve identical to curve A.

The details of the conductance relaxation phenomenon discussed above are peculiar to the material used to induce the voltage-dependent conductance. In the case of monazomycin, the conductance decrease results from material moving out of the membrane at a finite rate in the absence of an applied potential. It is important to realize that the rate constant for the conductance decay is proportional to the membrane conductance. This rate constant will thus get smaller as a consequence of the removal of monazomycin from the membrane. Therefore, as monazomycin leaves the membrane, and the conductance decays, further decreases in the conductance becomes slower and slower.

The foregoing characteristics of the structure shown in FIG. 1 allow it to be used as a memory element. To use the structure in such a manner, a "state-changing" potential is applied across membrane 1 of a magnitude and duration sufficient to cause channels to be incorporated into the membrane.

The magnitude of the state-changing potential required varies as a function of the monazomycin concentration and the membrane area, all other factors being equal. The required magnitude of the state-changing potential decreases as the monazomycin concentration and the membrane area increases. The required magnitude of the state-changing potential will also depend upon the time the potential is applied across the membrane: the longer one is willing to wait before the conductance begins to increase significantly above the background conductance of the unmodified bilayer, the lower the state-changing potential can be. A useful range for the state-changing potential is 500 to 1000 mV, which is sufficient to introduce monazomycin into the membrane, or to remove the channels from the membrane, in a time on the order of one millisecond.

The state-changing potentials may be applied to either "turn on" or "turn off" the memory element. For example, if a positive state-changing potential is applied the material inducing the voltage-dependent conductance will form channels in membrane 1 to render it conductive. For purposes of this disclosure, when membrane 1 is conductive, the memory element will be considered to be "on", or storing a binary digit (a bit equal to "1"). Thus, a positive state-changing potential stores a "1" in the memory element. If membrane 1 were already conductive, application of a positive state-changing potential does not change the memory element's "on" state.

If, however, a negative state-changing potential is applied to the membrane in FIG. 1 (that is, a potential difference where electrode 4 is negatively charged relative to electrode 5), which prior to application of such potential was conductive, then the material inducing the voltage-dependent conductance is driven out of membrane 1, causing it to become non-conductive. Thus, a negative state-changing potential turns the memory element "off", or stores a zero in the memory element. If membrane 1 were already non-conductive, application of a negative state-changing potential does not change the memory element's "off" state.

The next step in using the structure of FIG. 1 as a memory element is to apply an "interrogation" potential across the membrane 1, between liquid 2 and liquid 3, in a direction tending to cause cations to flow across the membrane, from liquid 2 to liquid 3. This interrogation potential can be of a magnitude less than that required to change the membrane conductance state (by a change in the number of monazomycin channels in the membrane). If membrane 1 has not previously been rendered conductive, application of the interrogation potential (with a magnitude of 50-100 mV) will cause an insignificant ion movement from liquid 2 to liquid 3. If, however, membrane 1 has previously been rendered conductive, the application of the interrogation potential will cause a large ionic current flow from liquid 2 to liquid 3. Thus the next step in using the structure of FIG. 1 as a memory element is to detect the current flow, across the membrane, that is caused by the applied interrogation potential. A significant current indicates that a one is stored in the memory element. A very small current indicates that a zero is stored in the memory element.

Alternatively, one can apply an interrogation current across the electrodes 4 and 5, and measure the resulting potential difference between the two electrodes. If the membrane conductance is high, one will observe a small potential difference; however, if the membrane conductance is low one will observe a high potential difference. Since the interrogation process must not affect the state of the memory element, it is necessary that the current be very small, on the order of picoamperes, and sufficiently brief, so that the potential difference across a membrane devoid of channels will not act as a state-changing potential.

As stated previously, the rate constant at which the membrane conductance decreases after excitation varies as a function of the membrane composition and the membrane conductance. Depending upon the composition of lipid bilayer membrane 1 and the particular substance used to induce voltage-dependent conductance, reasonable membrane conductances will persist from milliseconds to hours. (The membrane conductance should be at least 100 times larger than the background conductance of the unmodified bilayer ($10^{-9}$ to $10^{-8}$ S/cm$^2$); the upper limit is determined by the conductance of the liquid phases 2 and 3, because it is necessary that the membrane conductance be much less (at least ten-fold) than the conductance of the aqueous phases, to ensure that the potential difference between electrodes 4 and 5 is adequately reflected in the potential difference across the membrane. An upper estimate for the acceptable membrane conductance is about 0.001 S/cm$^2$ for components with a linear distance of 1 cm between the electrodes, 4 and 5, and about 1 S/cm$^2$ for components with 10 micrometers between the electrodes.) For monazomycin as the substance that induces the voltage-dependent conductance, the membrane conductance will be sufficiently large for the component to be "on" for 1 to 10 min after the application of the state-changing potential. Thus, the application of an interrogation potential should take place in the time-interval during which membrane conductivity, if previously subject to a positive (or activating) state-changing potential, would be sufficient to yield a reasonably detectable current.

The memory element can be periodically refreshed, as is typically done in the case of semiconductor dynamic random access memory elements. With the structure shown in FIG. 1, refresh involves the application of a potential across the membrane 1 sufficient to reset the current-voltage relation to that of curve B of FIG. 5. The refresh process can be implemented by two different mechanisms. One mechanism for the refresh is a two-step process: first, the state of the system is tested by interrogating each element at periodic intervals less than the duration of the "on" state; second, the outcome of the interrogation process is used to control the state-changing circuitry. Elements that are "on" are refreshed by applying a positive state-changing potential; while elements that are "off" are not touched. This mechanism is in principle similar to the refresh which occurs in dynamic random access memories.

The second mechanism that can be used for refresh utilizes particular kinetic characteristics of certain of the materials inducing voltage-dependent conductance in the membrane. The basic principle is illustrated in FIGS. 6A–6F, which show the current responses with time (FIGS. 6A–6C) for three different imposed potential differences. First is shown the current response (FIG. 6A) to a potential (FIG. 6D) that is less than a state-changing potential; second is shown the current response (FIG. 6B) to a brief state-changing potential (FIG. 6E); and third is shown the current response (FIG. 6C) to a potential of the same magnitude as the first potential (FIG. 6F), applied at a time where there still are channels in the membrane. As can be seen by reference to FIGS. 6C and 6F, the membrane conductance is "refreshed", i.e. increased to a value which is roughly comparable to the membrane conductance right after the state-changing potential was applied. It is thus possible to refresh the state of a memory element simply by applying a refresh potential difference across the element, regardless of whether it is storing a "1" or a "0", provided that the refresh potential is chosen to be less than a state-changing potential, but sufficiently large that the membrane conductance is increased substantially.

As just stated above, the second refresh mechanism depends upon the particular kinetic characteristics of certain of the materials inducing voltage-dependent conductance in the membrane. Specifically, the second refresh mechanism relies upon the particular kinetic features of monazomycin-induced conductance changes. Other materials that replicate those kinetic features are also suitable. The first refresh mechanism however is less dependent upon the kinetic behavior of the material that induces voltage-dependent conductance in the membrane and therefore allows use of a greater number of materials.

Figure 7A:
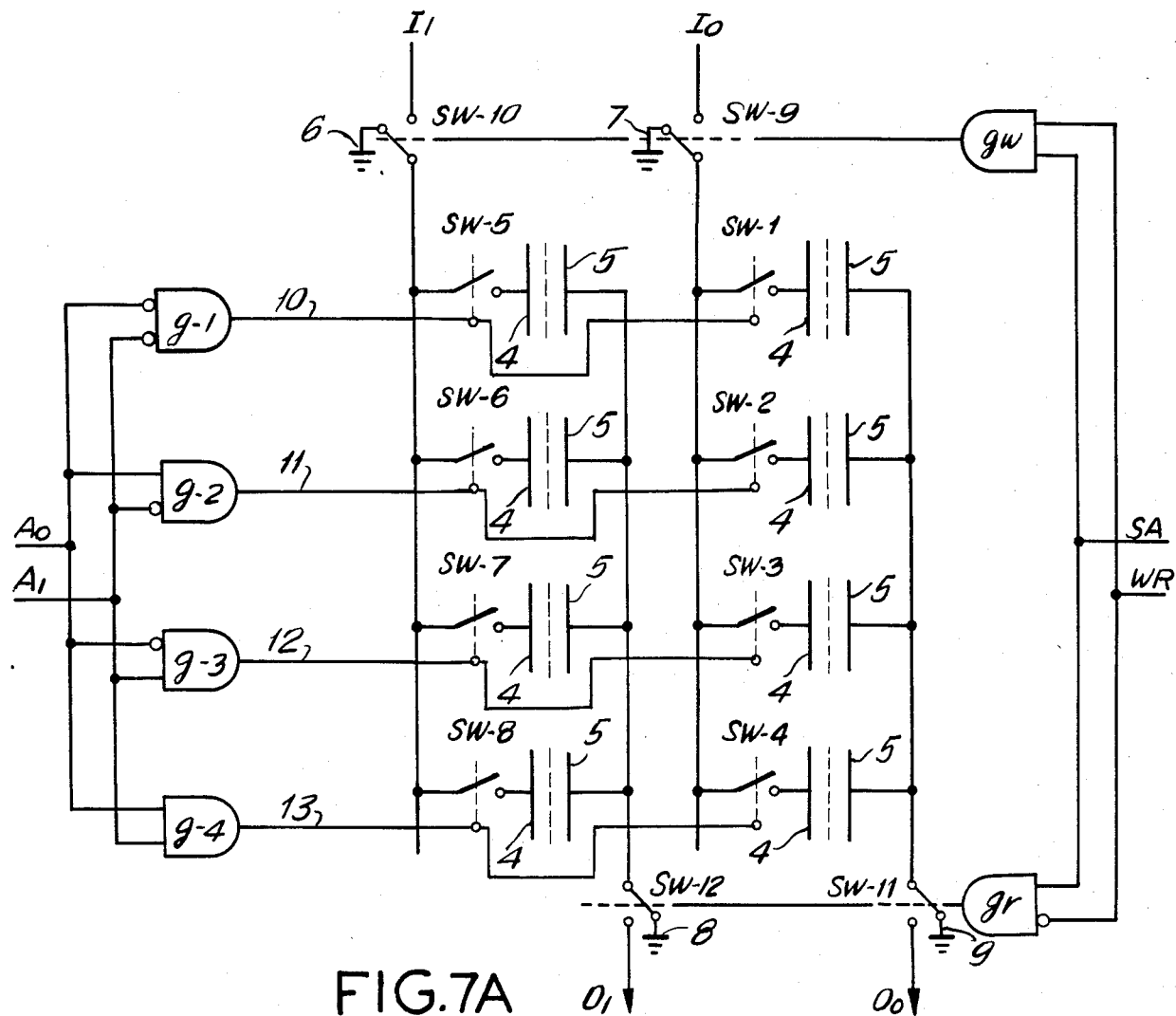
FIGS. 7A and 7B are schematic drawings of a memory array according to the present invention.

A plurality of memory elements as just described can be arranged into a memory array, such as would be useful in digital electronic computers and the like. The logic circuitry of the array is similar to that used to operate dynamic random access memories, except that the operating voltages are lower, and the refresh cycles much longer. FIG. 7 shows an exemplary logical structure of a 4×2 memory array (four 2-bit words), for the two different refresh schemes described above. FIG. 7A shows the array structure utilized where the state of each memory location is sensed before refresh. The word address lines $A_0$ and $A_1$ enter from the left, the write lines $I_1$ and $I_0$ enter from the top, the array select line SA and the write-enable/read-enable line WR enter from the right, and the read lines $O_1$ and $O_0$ enter from the bottom. The address and write-enable/read-enable lines, $A_0$, $A_1$, and WR, control access to the memory elements through the switches sw-1 through sw-12, with sw-1 through sw-8 controlling the addressing, and sw-9 through sw-12 controlling the writing/reading. Word address lines $A_0$ and $A_1$ are decoded by four AND gates g-1 through g-4, the outputs 10-13 from which control the state of address switches sw-1 through sw-8. Array select and write-enable/read-enable lines SA and WR are decoded by two AND gates, $g_w$ and $g_r$, the output of which control the state of the write-enable switches sw-9 and sw-10 and the read-enable switches sw-11 and sw-12. Switches sw-9 through sw-12 control the connection of electrodes 4 and 5 of each memory element to the external circuitry. Electrode 4 in each memory element is switched via switches sw-9 or sw-10 between electrical grounds 6 or 7 and write lines $I_1$ or $I_0$, while electrode 5 is switched via switches sw-12 or sw-11 between electrical grounds 8 and 9 and read lines $O_1$ or $O_0$.

A memory location in one of the words, a bit, is set to 1 by selecting the word, via address lines $A_0$ and $A_1$, enabling SA and WR, thereby switching sw-9 and sw-10 to connect electrode 4 of each element of the selected word to $I_0$ or $I_1$, and thereby switching sw-11 and sw-12 to ground, to connect electrode 5 of each element of the selected word to ground. A positive state-changing potential is applied at the appropriate write line. Since electrode 5 is connected to ground, the state-changing potential will be applied across the memory element, and the bit will set equal to 1. This bit can at a later time be set to zero by applying a negative state-changing potential to the appropriate write line for that memory element.

The state of the memory elements of each word of the array can be monitored by the two different mechanisms disclosed above. In the first scheme, the one shown in FIG. 7A, the word is addressed, the array is read-enabled, and the conductivity of the membrane is sensed by application of an interrogation potential and sensing the resulting current. This can be accomplished, for example, by connecting each of $O_1$ and $O_0$ to the "minus" input of an operational amplifier (not shown) set in the current-to-voltage converter mode. The selected word is enabled via address lines $A_0$ and $A_1$, SA is enabled, and WR is set low, thereby switching sw-9 and sw-10 to ground and switching sw-11 and sw-12 to connect electrode 5 of each memory element of the selected word to $O_1$ or $O_0$. A negative interrogation potential is applied to the "plus" input of the operational amplifier. (This is equivalent to having a positive potential difference between electrodes 4 and 5). The resulting current flowing across membrane 1 in the memory element is monitored as the voltage output from the current-to-voltage converter. The voltage output from the current-to-voltage converter constitutes the output from the array. (Note the current through the memory element will flow from electrode 4 to electrode 5, as the former is positive relative to the latter.)

In the second scheme for monitoring the state of the memory elements of each word of the array, the word is again addressed, the array is read-enabled, and a brief interrogation current pulse is applied via $O_1$ and $O_0$ to the enabled memory elements, causing current to flow in each enabled element from electrode 5 to electrode 4. The resulting voltage deflection constitutes the output from the array.

The refresh of the state of the element will in either read mode be determined by the result of the query. If, in a refresh cycle, a bit is read to be equal to 1, appropriate circuitry (not shown) will apply a positive state-changing potential to the memory element; whereas if it is read to be equal to zero, no state-changing potential is applied to it.

Figure 7B:
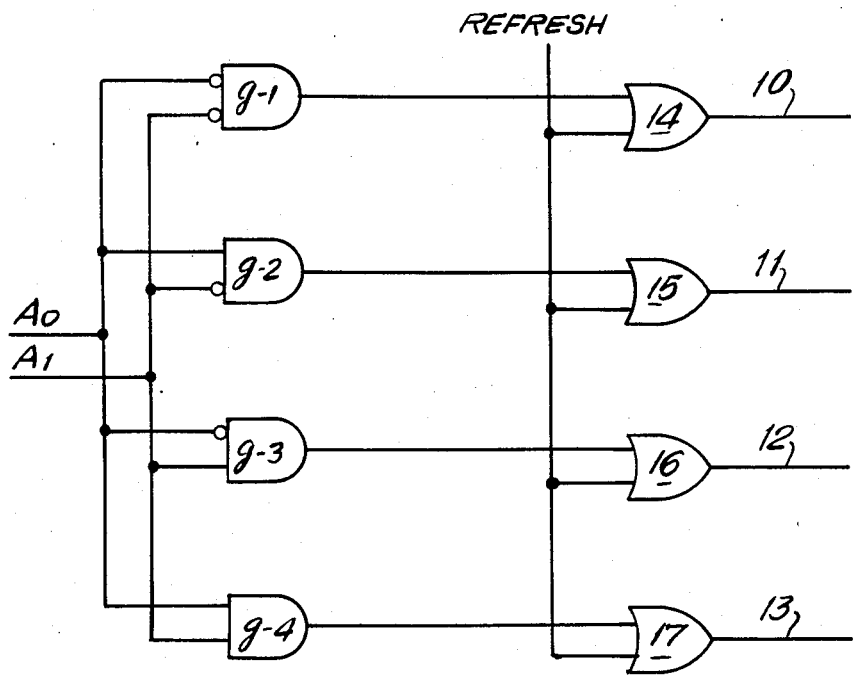

The second mechanism for refresh, in which an element is subject to refresh whether or not it is storing a "1" or a "0", can be implemented in two ways. First, it is possible to select and write-enable the array, and then apply a refresh potential to $I_1$ and $I_0$ that is large enough to introduce more channels into a membrane that already contains channels, but not large enough to introduce channels into a membrane that contains no channels. Each word in the array is then successively enabled. Second, with some change to the logic shown in FIG. 7A, all memory elements can be enabled simultaneously. Referring to FIG. 7B, there is shown the address decoder logic and output lines 10-13 therefrom, with OR gates 14-17 interposed between lines 10-13 and the decoder logic. A REFRESH line is connected to each of the OR gates 14-17. The circuitry is otherwise the same as that in FIG. 7A, and therefore is not shown. Using the circuitry of FIG. 7B, it is thus possible simultaneously to refresh all elements of the array, simply by setting the REFRESH line high, selecting and write-enabling the array, and applying a potential difference to write lines $I_1$ and $I_0$ that is large enough to introduce more channels into a membrane that already contains channels, but not large enough to introduce channels into a membrane that contains no channels.

The application of a state-changing potential, interrogation of an element, or refreshing an element causes ions to migrate from one liquid phase to the other. After repeated applications of membrane potentials not equal to zero, it is possible that a sufficient number of cations will have migrated from one liquid to the other to change their ionic compositions. For example, if a solution of potassium chloride is used as the electrically conductive ionic solution component of the liquid phases, in which case potassium ions would be the ionic species carrying the current across the membrane, application of a positive potential causes potassium ions in liquid phase 2 to migrate across the membrane into liquid phase 3. Liquid phase 2 will consequently be depleted of potassium ions, while liquid phase 3 will be enriched in the same ions. The depletion of potassium ions in liquid phase 2 must be accompanied by a corresponding depletion of anions (chloride), which will occur at electrode 4 via an electrochemical reaction. Similarly, the enrichment with potassium in liquid phase 3 must be accompanied by a corresponding enrichment with chloride via an electrochemical reaction at electrode 5. This polarization will (slowly) lead to an increase in the electrical resistance of the system, and to the establishment of an electromotive force which will counterbalance the tendency of the cations to move across the membrane, from positive to negative potential during the interrogation phase, and the system will eventually become non-functional.

The rate at which this final state occurs will depend upon the characteristics of the electrical circuitry outside the memory element. It is in principle possible to re-establish the original composition of the two liquid phases, if the two electrodes are short-circuited together in the intervals between application of the state-changing or interrogating potentials, provided that these intervals are very long. This would be acceptable if the element is not used very much.

Instead of re-establishing the original composition of the two liquid phases as described above, the described changes in the chemical composition of the liquid phases 2 and 3, can be prevented by either mechanical or electrochemical means. A mechanical embodiment can comprise means for constantly perfusing the two liquid phases with solutions of fixed ionic composition. The perfusion can be done by having tubes for drawing off the liquids, and other tubes for replacing the liquids. The latter tubes are connected to sources of liquid that have same chemical composition as the liquid that initially was in the two liquid phases. The rate of perfusion must be large enough that the ionic composition of the liquid phases will not be significantly altered by the activity of the element.

An electrochemical means for maintaining constant the ionic composition of the two liquid phases 2 and 3 involves employing an acid as the ionic component of both liquid phases. The acid must be of a type that will not attack membrane 1; hydrochloric acid is preferred because it is chemically fairly inert at concentration up to 0.1M. Additionally, electrodes 4 and 5 should be made of a material that is capable of interconverting molecular hydrogen and protons at reasonably low potentials. Platinum is the preferred material, because the overpotentials necessary for converting $H^+$ to $H_2$ and vice versa, are small compared to the other potential differences that operate in this system. (The two electrodes may not remain perfectly reversible with use; but the offset potential, the potential difference between the aqueous solution and the platinum metal, should be comparable in a $H_2$ atmosphere. The potential *differences* which are applied across the element illustrated in FIG. 1, between the two electrodes, should thus be reflected in the potential differences between the two liquid phases; i.e. in the transmembrane potential difference.)

In the foregoing system, application of a positive potential causes hydrogen ions (protons) in liquid 2 to migrate across membrane 1 into liquid 3. At contact with electrode 5, the protons are converted to electrically neutral molecular hydrogen, which can freely diffuse back across membrane 1 into liquid 2. At electrode 4, the molecular hydrogen is converted back into protons, thus replenishing the supply of cations in liquid 1. The rate of diffusion of the molecular hydrogen is of sufficient magnitude to replenish the supply of cations.

The foregoing embodiment is analogous to a dynamic memory element. It is also possible to fabricate an embodiment that is analagous to a static memory element. As in the prior embodiment, a substance that induces voltage-dependent conductance is added only to liquid phase 2. In this embodiment, Monazomycin or Alemethicin can be used. Either induces a voltage-dependent conductance for cations in membrane 1.

However, this embodiment differs from that previously described in the following ways. First, liquid phases 2 and 3 must have different ionic concentrations. Thus, for example, if hydrochloric acid is used as the ionic component of the liquid phases, then liquid phase 2 must have a lower concentration of hydrochloric acid than liquid phase 3. Second, micromolar amounts of a material inducing voltage-independent (i.e., constant) conductance in the membrane must be present in equal amounts in phases 2 and 3. Further, the ionic permeability of the voltage-independent material must differ from that of the voltage-dependent substance. Amphotericin B and Nystatin, both commercially available, satisfy these requirements. Such material, when added to liquid phase 2 and liquid phase 3 bathing membrane 1, induce a voltage-independent conductance by creating channels in membrane 1 that are selective for anions ($Cl^-$ in the present case). The material inducing voltage-dependent conductance in contrast creates channels in membrane 1 that are selective for cations ($H^+$ in the present case).

If the hydrochloric acid gradient is large enough, and certain concentrations of monazomycin (or alemethicin) and nystatin (or amphotericin B) are used, the system composed of membrane 1, liquid phases 2 and 3 and electrodes 4 and 5 will comprise a bistable system. That is, it will be found that the voltage difference across the membrane will remain constant with time at either $+E$ or $-E$ in the absence of current. If the conductance due to the substance inducing voltage-dependent conductance ($G_m$) is much less than the fixed conductance due to the substance inducing voltage-independent conductance ($G_n$), then the membrane potential V will be given by:

$$V \approx E_{Cl} = \frac{RT}{Z_{Cl}F} \cdot \left( \log \frac{[Cl]_3}{[Cl]_2} \right),$$

where $E_{Cl}$ is the Nernst potential for $Cl^-$, R is the universal gas constant, T is the absolute temperature and F is the Faraday constant. $Z_{Cl}$ is the valence of $Cl^-(-1)$, $[Cl]_3$ is the concentration of $Cl^-$ in liquid phase 3 and $[Cl]_2$ is the concentration of $Cl^-$ in liquid phase 2. Since $[Cl]_3$ is larger than $[Cl]_2$ and since $Z_{Cl} = -1$, V will be negative.

If $G_M$ is much greater than $G_N$, the membrane potential will be given by:

$$V \approx E_H = \frac{RT}{Z_H F} \cdot \left( \log \frac{[H]_3}{[H]_2} \right),$$

where $E_H$ is the Nernst potential for $H^+$, $Z_H$ is the valence of hydrogen (+1), $[H]_3$ is the concentration of hydrogen in liquid phase 3 and $[H]_2$ is the concentration of hydrogen in liquid phase 2. Since $[H]_3$ is larger than $[H]_2$ and $Z_H = +1$, V will be positive. Moreover, since $[H]_3 = [Cl]_3$ and $[H]_2 = [Cl]_2$ (from electroneutrality), $E = E_H = -E_{Cl}$.

V must stay at $+E$ or $-E$ because of the voltage-dependence of the monazomycin conductance. If $G_M$ is much less than $G_N$, $V = -E$; V cannot spontaneously change because a negative voltage turns off the membrane conductance caused by the substance inducing voltage-dependent conductance. If $G_M$ is much larger than $G_N$, $V = -E$; again, V cannot spontaneously change because a positive voltage maintains the high conductance.

This bistable system can be used as a static memory element in the following way. If $V = E$, we will say that a binary 1 is stored. Similarly, if $V = -E$, we will say that a binary zero is stored. The stored binary digit is recalled by sensing the voltage difference between electrodes 4 and 5, as by passing an interrogation current between the electrodes. The stored digit can be changed by passing a current through membrane 1, as by inducing an electrical potential between electrodes 4 and 5. If a current of sufficient magnitude and duration is passed from electrode 4 to electrode 5, the system will afterwards be in the 1 state, regardless of its initial state. Similarly, if a current of sufficient magnitude and duration is passed from electrode 5 to electrode 4, the system will afterwards be in the zero state, regardless of its initial state.

The static memory element just disclosed can be used in the array shown in FIG. 7A, discussed above.

The bistable state that characterizes the element just disclosed depends upon maintaining different ionic concentrations in liquid phases 2 and 3. Over time, this concentration difference will decrease due to diffusion of ions across membrane 1. The deleterious effect of diffusion can be prevented by maintaining constant the ionic composition of liquid phases 2 and 3 by means of perfusion. With a constant ionic composition, the system constitutes a means of indefinitely storing digital information.

In this embodiment, no provisions need be made for refreshing the state of the system, since each of the two binary states is intrinsically stable. Hence, this embodiment is analogous to solid state static random access memory. This embodiment depends only on the steepness of the voltage-dependence of the substance inducing voltage-dependent conductance, and not on the details of the substance's kinetics, as did the preferred embodiment that is analagous to dynamic memory.

Indeed, any membrane modifier capable of inducing a sufficiently steep voltage-dependent conductance ($G_V$) in thin lipid membranes can serve as the basis of a static memory element similar to the one described in preferred embodiment 2, so long as another, voltage-independent ($G_I$) modifier exists that has a different ionic selectivity from the first. If these conditions are met, liquid phases 2 and 3 can be prepared with ionic compositions such that two stable voltage levels exist, one associated with $G_V$ being much less than $G_I$ and the other with $G_V$ being much greater than $G_I$. The state of the system can again be switched from one state to the other by passing currents of sufficient magnitude and duration and of appropriate direction through the membrane by means of electrodes 4 and 5.

A macroscopic realization of the dynamic memory element disclosed herein can be made as follows: a planar lipid bilayer membrane will be formed at room temperature, using standard techniques, across a hole (diameter about 200 microns) in a 100 micron thick Teflon ® partition separating two aqueous phases of a Teflon ® chamber (volume 5.0 ml, 2.5 ml of each solution). The membrane-forming solution will be bacterial phosphatidylglycerol (Supelco, Inc., Bellefonte, Pa.) and cholesterol (Sigma Chemical Co., St. Louis, Mo.), molar ratio 1,2, dissolved in n-decane (Wiley. Organics, Columbus, Ohio). The aqueous phases will be 0.01M HCl (Ultrapure grade, E. Merck through MCB, Cincinnati, Ohio). Electrical contact to the aqueous phases will be through platinized platinum electrodes bubbled with $H_2$, at a partial pressure of one atmosphere. Monazomycin will be added to one of the aqueous phases, to a concentration of about 2 micromolar. Initiation of monazomycin-induced channel activity, changing the state of the membrane can be accomplished by applying a potential difference of about 600 mV across the membrane for about one millisecond, the monazomycin-containing solution being positive. This will lead to an increase in the membrane conductance from about $10^{-11}$ S to greater than $10^{-7}$ S. The conductance increase will last for many minutes, and the system will have a conductance larger than $10^{-9}$ S for about 1 minute. The state of the membrane can be determined by applying 50 mV across the membrane, and the system can be refreshed by applying about 200 mV across the membrane.

A macroscopic realization of the static memory element disclosed herein requires addition of Nystatin to both aqueous phases to a concentration of 5 micrograms/ml and raising the amount of HCl in the aqueous phase not containing monazomycin to a concentration of about 0.077M. Applications of a state-changing potential between electrodes 4 and 5 of a magnitude sufficient to produce about 3.75 nA across membrane 1 for 30 s or less will cause the system to flip-flop between stable states of about $+40$ mV and $-40$ mV, depending on whether a positive or negative state-changing potential is applied.

We claim:

1. A method of changing the state of a circuit component, and determining the state; wherein the component is comprised of a lipid bilayer membrane, a first liquid phase in contact with a first surface of the membrane, a second liquid phase in contact with the second surface of the membrane, the first liquid phase comprising two constituents, namely, an ionic solution that is electrically conductive and a material that is capable of inducing voltage-dependent conductance in the membrane, the second liquid phase comprising an ionic solution that is electrically conductive; comprising the steps of:
- (a) applying a state-changing potential, across the membrane and the first liquid phase, of a magnitude and for a duration sufficient to change the conductivity of the membrane;
- (b) applying an interrogation potential across the first liquid phase, the membrane and the second liquid phase in a direction tending to cause positive charge to flow from the first liquid phase to the second liquid phase, of a magnitude less than that required to change the state of the membrane conductivity; and
- (c) detecting the current flow, across the membrane, caused by the applied interrogation potential.

2. The method as in claim 1, wherein the magnitude of the state-changing potential is in the range of 500 to 1000 millivolts.

3. The method as in claim 2, wherein the state-changing potential is applied for a duration on the order of one millisecond.

4. The method as in claim 1, wherein the magnitude of the interrogation potential is in the range of 50 to 100 millivolts.

5. A method of changing the state of a circuit component, and determining the state; wherein the component is comprised of a lipid bilayer membrane, a first liquid phase in contact with a first surface of the membrane, a second liquid phase in contact with the second surface of the membrane, the first liquid phase comprising two constituents, namely, an ionic solution that is electrically conductive and a material that is capable of inducing voltage-dependent conductance in the membrane, the second liquid comprising an ionic solution that is electrically conductive; comprising the steps of:
- (a) applying a state-changing potential, across the membrane and the first liquid, of a magnitude and for a duration sufficient to change the conductivity of the membrane;
- (b) applying an interrogation current across the first liquid, the membrane and the second liquid in a direction causing positive charge to flow from the first liquid to the second liquid, of a magnitude and for a duration sufficiently small so as not to change the state of the membrane conductivity; and
- (c) detecting the potential difference across the membrane.

6. The method as in claim 5, wherein the magnitude of the interrogation current is on the order of picoamperes.

7. A method of refreshing the states of the components of an array of circuit components; wherein each component of the array comprises a lipid bilayer membrane, a first liquid phase in contact with a first surface of the membrane, a second liquid phase in contact with the second surface of the membrane, the first liquid phase comprising two constituents, namely, an ionic solution that is electrically conductive and a material that is capable of inducing voltage-dependent conductance in the membrane, the second liquid phase comprising an ionic solution that is electrically conductive; comprising:
periodically applying, to each component, a refresh potential across the membrane in a direction that would tend to cause positive charge to flow from the first liquid phase to the second liquid phase, of a magnitude less than that required to change the state of the membrane conductivity, but sufficiently large to substantially increase membrane conductivity if the membrane was previously rendered conductive, the period between applications being sufficiently short to yield a detectable current after application if the membrane was previously rendered conductive.

8. The method as in claim 7, wherein the refresh potential is applied simultaneously to each component of the array.

9. A method of refreshing the states of an array of circuit components; wherein each component of the array comprises a lipid bilayer membrane, a first liquid in contact with a first surface of the membrane, a second liquid in contact with the second surface of the membrane, the first liquid comprising two constituents, namely, an ionic solution that is electrically conductive and a material that is capable of inducing voltage-dependent conductance in the membrane, the second liquid comprising an ionic solution that is electrically conductive; comprising:
- (a) periodically applying, to each component, an interrogation potential or current across the membrane in a direction that would tend to cause positive charge to flow from the first liquid phase to the second liquid phase, to determine whether or not the component is conductive; and
- (b) applying a positive state-changing potential to the component if the component was found to be in a conductive state.

10. A circuit component comprising:
- (a) a lipid bilayer membrane;
- (b) a first liquid phase in contact with a first surface of the membrane, the first liquid phase comprising an ionic solution that is electrically conductive and a material that is capable of inducing voltage-dependent conductance in the membrane;
- (c) a second liquid phase in contact with the second surface of the membrane, the second liquid phase comprising an ionic solution that is electrically conductive;
- (d) means for inducing an electrical potential across the first liquid phase, the membrane and the second liquid phase; and
- (e) means for maintaining constant the concentration of ionic charge carriers in the liquid phases.

11. The circuit component as in claim 10, wherein the means for maintaining constant the concentration of ionic charge carriers in the liquid phases comprises means for drawing off at least a portion of the liquid from each liquid phase and replacing the liquid drawn off from each with liquid of the same chemical composition, but having a charge carrier concentration substantially equal to the charge carrier concentration of that liquid phase prior to application of any state-changing, refresh or interrogation currents or potentials.

12. The circuit component as in claim 10, wherein the material capable of inducing voltage-dependent conductance is monazomycin.

13. The circuit component as in claim 12, wherein a highly polar group is coupled to the mannose group of each of the monazomycin molecules to anchor the monazomycin to the first liquid phase, thereby to prevent permeation of monazomycin through the membrane.

14. The circuit component as in claim 13, wherein the highly polar group is a sulfated sugar.

15. The circuit component as in claim 12, wherein the monazomycin concentration is in the range from $10^{-9}$ to $10^{-4}$M.

16. A circuit component that is able to maintain the concentration of charge carriers constant, in the presence of a net current, comprising:
   (a) a lipid bilayer membrane;
   (b) a first acidic solution in contact with a first surface of the membrane;
   (c) a material, capable of inducing voltage-dependent conductance in the membrane, dissolved in the first acidic solution;
   (d) a second acidic solution in contact with the second surface of the membrane;
   (e) a first electrode in contact with the first acidic solution;
   (f) a second electrode in contact with the second acidic solution;
   (g) the first electrode made of a material that converts molecular hydrogen to protons when a small positive potential is applied to the first electrode relative to the second electrode; and
   (h) the second electrode made of a material that converts protons to molecular hydrogen, when a small negative potential is applied to the second electrode relative to the first electrode.

17. The circuit component as in claim 16, wherein the first acidic solution and the second acidic solution are hydrochloric acid.

18. The circuit component as in claim 16, wherein the material capable of inducing voltage-dependent conductance is monazomycin.

19. The circuit component as in claim 18, wherein a highly polar group is coupled to the mannose group of the monazomycin molecules to anchor the monazomycin to the first liquid phase, thereby to prevent permeation of monazomycin through the membrane.

20. The circuit component as in claim 19, wherein the highly polar group is a sulfated sugar.

21. The circuit component as in claim 18, wherein the monazomycin concentration is in the range from $10^{-9}$ to $10^{-4}$M.

22. The circuit component as in claim 16, further comprising means for hermetically sealing the circuit component to prevent diffusion from the component of molecular hydrogen.

23. The circuit component as in claim 16, wherein the first electrode and the second electrode are made of platinum.

24. A memory array comprising:
   (a) a plurality of separately addressable words, each word comprising at least one memory element, each memory element comprising:
      (i) a lipid bilayer membrane;
      (ii) a first liquid phase in contact with a first surface of the membrane, the first liquid phase comprising an electrically conductive ionic solution and a material, capable of inducing voltage-dependent conductance in the membrane, dissolved therein;
      (iii) a second liquid phase in contact with the second surface of the membrane, the second liquid phase comprising an electrically conductive ionic solution;
   (b) means for applying a state-changing potential to each memory element of each word; and
   (c) means for applying an interrogation potential or current to each memory element of each word.

25. A method of changing the state of a circuit component, and determining the state; wherein the component is comprised of a lipid bilayer membrane, a first liquid phase in contact with a first surface of the membrane, a second liquid phase in contact with the second surface of the membrane, the first liquid phase comprising three constituents, namely, an ionic solution that is electrically conductive, a material that is capable of inducing voltage-independent conductance in the membrane, and a material that is capable of inducing voltage-dependent conductance in the membrane, the second liquid phase comprising two constituents, namely, an ionic solution that is electrically conductive and a material that is capable of inducing voltage-independent conductance in the membrane, the concentration of the ionic solution in the second liquid phase being greater than the concentration of the ionic solution in the first liquid phase; comprising the steps of:
   (a) changing the conductivity of the membrane by applying a state-changing potential, across the membrane and the first liquid phase, of a magnitude and for a duration sufficient to change the membrane conductivity; and
   (b) measuring the potential across the membrane.

26. A memory array comprising:
   (a) a plurality of separately addressable words, each word comprising at least one memory element, each memory element comprising:
      (i) a lipid bilayer membrane;
      (ii) a first liquid phase in contact with a first surface of the membrane, the first liquid phase comprising an electrically conductive ionic solution;
      (iii) a material, capable of inducing voltage-dependent conductance in the membrane, dissolved in the first liquid phase;
      (iv) a second liquid phase in contact with the second surface of the membrane, the second liquid phase comprising an electrically conductive ionic solution, the concentration of ionic charge carriers in the second liquid phase being greater than the concentration of ionic charge carriers in the first liquid phase;
      (v) a material, capable of inducing voltage-independent conductance in the membrane, dissolved in the first liquid phase and the second liquid phase;
   (b) means for applying a state-changing potential to each memory element of each word; and
   (c) means for applying an interrogation current to each memory element of each word.

27. The circuit component as in claim 26, wherein the material capable of inducing voltage-dependent conductance in the membrane is alemethicin.

28. The circuit component as in claim 26, wherein the material capable of inducing voltage-dependent conductance in the membrane is monazomycin.

29. The circuit component as in claim 26, wherein the material capable of inducing voltage-independent conductance in the membrane is amphotericin B.

30. The circuit component as in claim 26, wherein the material capable of inducing voltage-independent conductance in the membrane is nystatin.

* * * * *